US012765096B2

(12) United States Patent
Matsugai et al.

(10) Patent No.: US 12,765,096 B2
(45) Date of Patent: Oct. 13, 2026

(54) IMAGING APPARATUS AND MANUFACTURING METHOD FOR IMAGING APPARATUS

(71) Applicant: SONY SEMICONDUCTOR SOLUTIONS CORPORATION, Kanagawa (JP)

(72) Inventors: Hiroyasu Matsugai, Kanagawa (JP); Atsushi Yamamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 595 days.

(21) Appl. No.: 18/258,355

(22) PCT Filed: Dec. 6, 2021

(86) PCT No.: PCT/JP2021/044629
§ 371 (c)(1),
(2) Date: Jun. 20, 2023

(87) PCT Pub. No.: WO2022/145175
PCT Pub. Date: Jul. 7, 2022

(65) Prior Publication Data

US 2024/0038802 A1 Feb. 1, 2024

(30) Foreign Application Priority Data

Dec. 28, 2020 (JP) ................................ 2020-219350

(51) Int. Cl.
*H10F 39/00* (2025.01)

(52) U.S. Cl.
CPC ....... *H10F 39/8057* (2025.01); *H10F 39/024* (2025.01); *H10F 39/804* (2025.01); *H10F 39/8063* (2025.01)

(58) Field of Classification Search
CPC ............ H10F 39/8057; H10F 39/8063; H10F 39/804; H10F 39/024
See application file for complete search history.

(56) References Cited

U.S. PATENT DOCUMENTS

2011/0069189 A1 3/2011 Venkataraman et al.
2011/0080487 A1 4/2011 Venkataraman et al.
(Continued)

FOREIGN PATENT DOCUMENTS

JP 2012-049400 3/2012
JP 2013-041878 2/2013
(Continued)

OTHER PUBLICATIONS

International Search Report and Written Opinion prepared by the Japan Patent Office on Feb. 8, 2022, for International Application No. PCT/JP2021/044629, 3 pgs.

*Primary Examiner* — Lin Ye
*Assistant Examiner* — Fayez A Bhuiyan
(74) *Attorney, Agent, or Firm* — SHERIDAN ROSS P.C.

(57) ABSTRACT

Provided are an imaging apparatus and a manufacturing method for an imaging apparatus that are advantageous for acquiring a captured image in which an influence of α rays is suppressed. An imaging apparatus includes: a sensor substrate having a photoelectric conversion element on which image-capturing light is incident; a cover substrate that covers the photoelectric conversion element and transmits the image-capturing light; and an α-ray transmission preventive film that transmits the image-capturing light.

20 Claims, 13 Drawing Sheets

(56) References Cited

U.S. PATENT DOCUMENTS

| | | | |
|---|---|---|---|
| 2012/0050590 | A1 | 3/2012 | Suzuki et al. |
| 2014/0252526 | A1 | 9/2014 | Wakiyama et al. |
| 2014/0333731 | A1 | 11/2014 | Venkataraman et al. |
| 2014/0333764 | A1 | 11/2014 | Venkataraman et al. |
| 2014/0333787 | A1 | 11/2014 | Venkataraman et al. |
| 2014/0340539 | A1 | 11/2014 | Venkataraman et al. |
| 2014/0347509 | A1 | 11/2014 | Venkataraman et al. |
| 2014/0354773 | A1 | 12/2014 | Venkataraman et al. |
| 2014/0354843 | A1 | 12/2014 | Venkataraman et al. |
| 2014/0354844 | A1 | 12/2014 | Venkataraman et al. |
| 2014/0354853 | A1 | 12/2014 | Venkataraman et al. |
| 2014/0354854 | A1 | 12/2014 | Venkataraman et al. |
| 2014/0354855 | A1 | 12/2014 | Venkataraman et al. |
| 2014/0355870 | A1 | 12/2014 | Venkataraman et al. |
| 2014/0368662 | A1 | 12/2014 | Venkataraman et al. |
| 2014/0368683 | A1 | 12/2014 | Venkataraman et al. |
| 2014/0368684 | A1 | 12/2014 | Venkataraman et al. |
| 2014/0368685 | A1 | 12/2014 | Venkataraman et al. |
| 2015/0009353 | A1 | 1/2015 | Venkataraman et al. |
| 2015/0009354 | A1 | 1/2015 | Venkataraman et al. |
| 2015/0009362 | A1 | 1/2015 | Venkataraman et al. |
| 2015/0234151 | A1 | 8/2015 | Venkataraman et al. |
| 2015/0235371 | A1 | 8/2015 | Venkataraman et al. |
| 2016/0227195 | A1 | 8/2016 | Venkataraman et al. |
| 2016/0267665 | A1 | 9/2016 | Venkataraman et al. |
| 2016/0269650 | A1 | 9/2016 | Venkataraman et al. |
| 2017/0006233 | A1 | 1/2017 | Venkataraman et al. |
| 2017/0186791 | A1 | 6/2017 | Wakiyama et al. |
| 2018/0007284 | A1 | 1/2018 | Venkataraman et al. |
| 2018/0048830 | A1 | 2/2018 | Venkataraman et al. |
| 2018/0188422 | A1* | 7/2018 | Fujii .................... G02B 3/0075 |
| 2019/0013341 | A1 | 1/2019 | Wakiyama et al. |
| 2019/0109998 | A1 | 4/2019 | Venkataraman et al. |
| 2019/0356863 | A1 | 11/2019 | Venkataraman et al. |
| 2020/0389604 | A1 | 12/2020 | Venkataraman et al. |

FOREIGN PATENT DOCUMENTS

| | | |
|---|---|---|
| JP | 2014-175465 | 9/2014 |
| JP | 2015-109667 | 6/2015 |
| JP | 2019-045652 | 3/2019 |

* cited by examiner

IMAGING APPARATUS AND MANUFACTURING METHOD FOR IMAGING APPARATUS

CROSS REFERENCE TO RELATED APPLICATIONS

This application is a national stage application under 35 U.S.C. 371 and claims the benefit of PCT Application No. PCT/JP2021/044629, having an international filing date of 6 Dec. 2021, which designated the United States, which PCT application claimed the benefit of Japanese Patent Application No. 2020-219350, filed 28 Dec. 2020, the entire disclosures of each of which are incorporated herein by reference.

TECHNICAL FIELD

The present disclosure relates to an imaging apparatus and a manufacturing method for an imaging apparatus.

BACKGROUND ART

Patent Document 1 discloses an imaging apparatus having a wafer chip scale package (WCPS) structure in which an optical element area is covered with a sealing glass.

CITATION LIST

Patent Document

Patent Document 1: Japanese Patent Application Laid-Open No. 2013-41878

SUMMARY OF THE INVENTION

Problems to be Solved by the Invention

In general, α rays (alpha rays) are emitted from a member such as glass.

When the α ray is incident on an image sensor together with image-capturing light, a white point appears in a portion corresponding to an incident location of the α ray in the image sensor, in an obtained captured image. The white point caused by α rays in the captured image in this way is also called a "subsequent white point", and may impair image quality of a subject image.

In the imaging apparatus of Patent Document 1, α rays emitted from the sealing glass are incident on the optical element area. Therefore, in a captured image acquired by the imaging apparatus of Patent Document 1, a white point that is not originally included in a subject image may appear.

The present disclosure has been made in view of the above circumstances, and an object thereof is to provide a technique advantageous for acquiring a captured image in which an influence of α rays is suppressed.

Solutions to Problems

One aspect of the present disclosure relates to an imaging apparatus including: a sensor substrate having a photoelectric conversion element on which image-capturing light is incident; a cover substrate that covers the photoelectric conversion element and transmits image-capturing light; and an α-ray transmission preventive film that transmits image-capturing light.

The α-ray transmission preventive film may have a thickness of 1 μm or less.

The α-ray transmission preventive film may have a transmittance of α rays of 0.001 count/h or less.

The α-ray transmission preventive film may be arranged between the sensor substrate and the cover substrate.

The α-ray transmission preventive film may be attached to the cover substrate.

A surface of the cover substrate on the sensor substrate side may have an uneven shape, and the α-ray transmission preventive film may be attached to the surface of the cover substrate on the sensor substrate side.

The imaging apparatus may include an antireflection film attached to the α-ray transmission preventive film.

The imaging apparatus may include an on-chip lens that covers the photoelectric conversion element, and the α-ray transmission preventive film may be located between the on-chip lens and the sensor substrate.

The imaging apparatus may include an on-chip lens that covers the photoelectric conversion element, and the α-ray transmission preventive film may be located on a side opposite to the sensor substrate via the on-chip lens.

The imaging apparatus may include a gas layer provided between the sensor substrate and the cover substrate.

The imaging apparatus may include a lower lens attached to a surface of the cover substrate on the sensor substrate side, and the lower lens may face the sensor substrate via the gas layer.

The imaging apparatus may include an antireflection film attached to a surface of the lower lens on the sensor substrate side.

The imaging apparatus may include an upper lens attached to a surface of the cover substrate on a side opposite to the sensor substrate, and an antireflection film attached to a surface of the upper lens on a side opposite to the cover substrate.

The imaging apparatus may include a support body that is located between the cover substrate and the sensor substrate and fixes the cover substrate to the sensor substrate, and the support body may include a light shielding part.

The imaging apparatus may include a light shielding body attached to a portion of the cover substrate outside a portion facing the photoelectric conversion element.

Another aspect of the present disclosure relates to an imaging apparatus including: a sensor substrate; a cover substrate; and a lower lens located between the sensor substrate and the cover substrate and facing the sensor substrate via a gas layer.

The gas layer may have a thickness of 20 μm or less.

The imaging apparatus may include an antireflection film attached to a surface of the lower lens on the sensor substrate side.

Another aspect of the present disclosure relates to a manufacturing method for an imaging apparatus, the manufacturing method including: a step of preparing a first layered body including a cover substrate and an α-ray transmission preventive film; a step of preparing a second layered body including a sensor substrate; and a step of layering the first layered body and the second layered body such that the α-ray transmission preventive film is located between the cover substrate and the sensor substrate.

Another aspect of the present disclosure relates to a manufacturing method for an imaging apparatus, the manufacturing method including: a step of preparing a first layered body including a cover substrate; a step of preparing a second layered body including a sensor substrate and an α-ray transmission preventive film; and a step of layering the first layered body and the second layered body such that the α-ray transmission preventive film is located between the cover substrate and the sensor substrate.

MODE FOR CARRYING OUT THE INVENTION

Embodiments of an imaging apparatus and a manufacturing method for an imaging apparatus will be described below with reference to the drawings.

Hereinafter, a description is given to an example of an imaging apparatus of a wafer-level chip size package (CSP) having a stacked image sensor structure in which a pixel portion (that is, a photoelectric conversion element portion) and a signal processing portion are stacked.

However, an application target of the technology described below is not limited to the imaging apparatus having the stacked image sensor structure and the imaging apparatus having the CSP structure. The technology described below can also be applied to an imaging apparatus having another structure and a manufacturing method for such an imaging apparatus.

First Embodiment

An imaging apparatus according to the present embodiment includes a lower lens located between a sensor substrate and a cover substrate.

Figure 1:
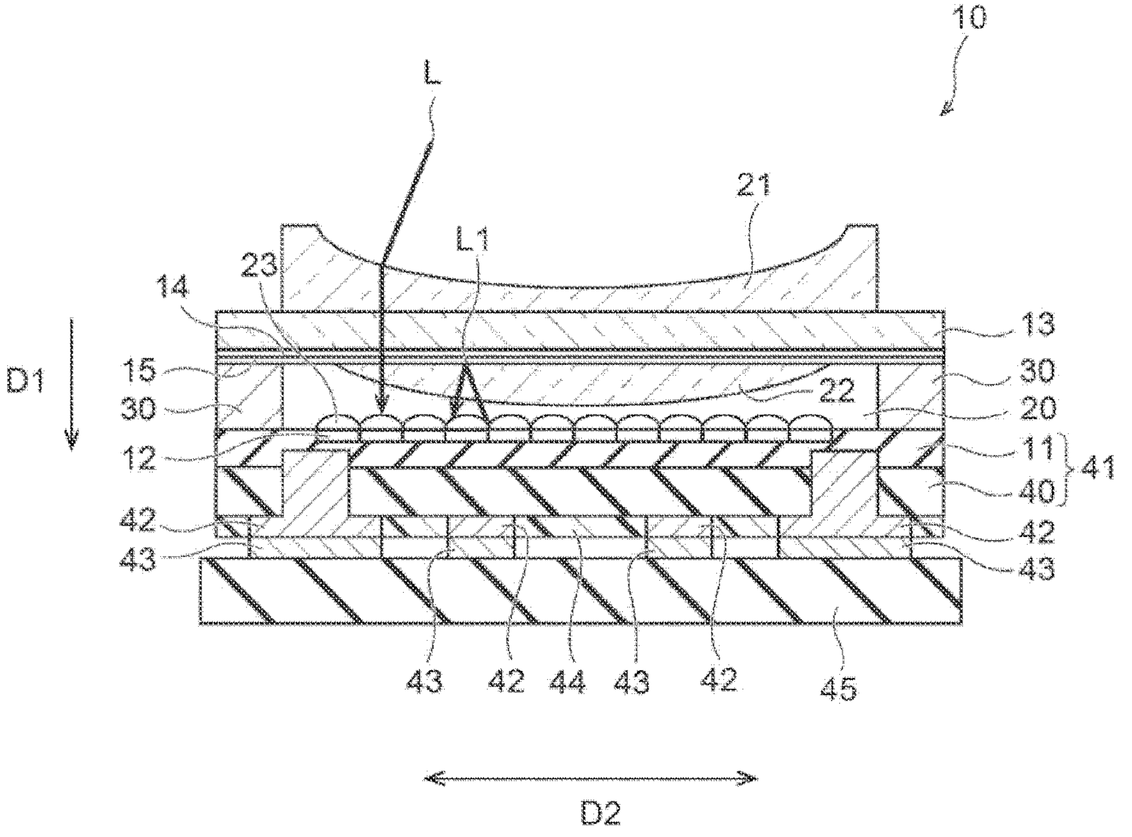
FIG. 1 is a view schematically illustrating a cross-sectional structure of an imaging apparatus according to an example of a first embodiment.

FIG. 1 is a view schematically illustrating a cross-sectional structure of an imaging apparatus 10 according to an example of a first embodiment.

The imaging apparatus 10 illustrated in FIG. 1 includes a sensor substrate 11, a cover substrate 13, and an α-ray transmission preventive film 14.

The sensor substrate 11 includes a large number of photoelectric conversion elements 12 on which image-capturing light L is incident and wiring (not illustrated) connected to each photoelectric conversion element 12. The photoelectric conversion elements 12 are two-dimensionally arranged in a layer extending direction D2 along a light receiving surface of the sensor substrate 11 (that is, a surface on the cover substrate 13 side), and output pixel signals corresponding to incident light.

The sensor substrate 11 is layered on a logic substrate 40, and is configured integrally with the logic substrate 40. The sensor substrate 11 and the logic substrate 40 having the integrated structure are collectively referred to as a layered substrate 41.

Although not illustrated, the logic substrate 40 includes a logic circuit, and wiring connected to the logic circuit. The logic circuit includes a signal processing circuit that processes a pixel signal from the photoelectric conversion element 12.

The layered substrate 41 has a plurality of wiring electrodes (including back surface electrodes) 42. FIG. 1 illustrates a wiring electrode 42 electrically connecting the wiring of the sensor substrate 11 and the wiring of the logic substrate 40, and a wiring electrode 42 electrically connected to the wiring of the logic substrate 40. The layered substrate 41 may include wiring electrodes 42 having other connection forms.

The wiring electrode 42 protrudes from a back surface of the layered substrate 41 (that is, a surface of the logic substrate 40 on a side opposite to the sensor substrate 11), and functions as a connection interface for an external device. The back surface of the layered substrate 41 is covered with a solder resist 44 which is an insulating film. In a state where a space between the wiring electrodes 42 protruding from the back surface of the layered substrate 41 is filled with the solder resist 44, an end surface portion of each wiring electrode 42 is exposed outward.

The exposed portion of the wiring electrode 42 illustrated in FIG. 1 is connected to a connection electrode 43 provided on a printed board 45. The wiring electrode 42 functions as a signal transmission path between the layered substrate 41 and the printed board 45, together with the connection electrode 43.

A light receiving surface of the sensor substrate 11 located on a side opposite to the logic substrate 40 (that is, a light incident surface of the plurality of photoelectric conversion elements 12) is covered with an on-chip lens 23. The on-chip lens 23 includes a plurality of microlenses. Each microlens condenses the image-capturing light L toward one or more allocated photoelectric conversion elements 12.

Although not illustrated, any functional layer (for example, a color filter layer) may be arranged between the on-chip lens 23 and the sensor substrate 11 (the photoelectric conversion element 12).

The cover substrate 13 covers the sensor substrate 11 (in particular, a light incident surface of all the photoelectric conversion elements 12 contributing to acquisition of a captured image), and transmits the image-capturing light L. The cover substrate 13 has a function of protecting the on-chip lens 23 and the sensor substrate 11 (in particular, the photoelectric conversion element 12), and can be configured with a transparent member (for example, glass) having excellent rigidity.

The cover substrate 13 illustrated in FIG. 1 is fixed to the layered substrate 41 (in particular, the sensor substrate 11) via a support body 30 which is also referred to as a “rib”. That is, the support body 30 is located between the cover substrate 13 and the sensor substrate 11, is attached to each of the cover substrate 13 and the sensor substrate 11, and fixes the cover substrate 13 to the sensor substrate 11. The support body 30 is provided so as to surround the plurality of photoelectric conversion elements 12, and forms a gas layer 20 inside.

The support body 30 having such a structure can be formed at a wafer level. In this case, the support body 30 can be accurately formed to a desired size (for example, a desired width and a desired height).

The support body 30 may have any material and any structure. As will be described later, a part or all of the support body 30 may be configured with a member (for example, a black resin, a color filter, or a bandpass filter) having relatively low or high wavelength selectivity with respect to a transmittance of light in a specific wavelength region. A part or all of the support body 30 may be configured with a functional member having desired optical characteristics, water resistance, and/or other characteristics, or such a functional member may be attached to the support body 30.

The gas layer 20 is located between the sensor substrate 11 and the cover substrate 13. The gas layer 20 is surrounded and hermetically sealed by the sensor substrate 11, the cover substrate 13, and the support body 30. The gas layer 20 illustrated in FIG. 1 is an air layer including air, but the gas layer 20 may include gas having desired characteristics other than air. For example, by enclosing gas providing a desired refractive index in the gas layer 20, it is possible to adjust light reflection characteristics at an interface between the gas layer 20 and a medium (for example, a lower lens 22 and the on-chip lens 23 in the imaging apparatus 10 illustrated in FIG. 1) adjacent to the gas layer 20.

A thickness of the gas layer 20 (that is, a size in a layering direction D1 in which the sensor substrate 11 and the cover substrate 13 overlap) is not limited. As described later, by bringing a light reflection interface (for example, a surface of the lower lens 22 on the sensor substrate 11 side or a surface of the cover substrate 13 on the sensor substrate 11 side) close to the sensor substrate 11, a flare and ghost (hereinafter, also simply referred to as a “flare”) in a captured image can be reduced.

Therefore, the thickness of the gas layer 20 is preferably small from the viewpoint of suppressing image quality degradation of a captured image caused by stray light L1. For example, in a case where the gas layer 20 has a thickness of 20 μm or less, a flare in a captured image can be effectively reduced.

To a surface of the cover substrate 13 on a side opposite to the sensor substrate 11, an upper lens 21 is attached. Whereas, to the surface of the cover substrate 13 on the sensor substrate 11 side, the lower lens 22 is attached. The lower lens 22 illustrated in FIG. 1 is located between the sensor substrate 11 and the cover substrate 13, and faces the sensor substrate 11 (in particular, the photoelectric conversion element 12) via the gas layer 20.

At a time of actual image-capturing, the image-capturing light L from a subject is incident on the photoelectric conversion element 12 through the upper lens 21, the cover substrate 13, the lower lens 22, and the on-chip lens 23, after an optical path is adjusted through a lens module (not illustrated). In this way, when the image-capturing light L is received by the plurality of photoelectric conversion elements 12, and a corresponding pixel signal is output from each photoelectric conversion element 12, a captured image of the subject is obtained.

When transmitting the image-capturing light L, the α-ray transmission preventive film 14 does not transmit a part (most) or all of α rays contained in the image-capturing light L.

The α-ray transmission preventive film 14 has a high film density and/or a high electron density capable of reducing a particles (alpha particles) in the image-capturing light L, by using deceleration of the α particles due to a reaction when the α particles collide with elements and/or electrons.

The α-ray transmission preventive film 14 can have any composition, and can include, for example, a material that absorbs, traps, reflects, and/or scatters α rays. The α-ray transmission preventive film 14 can have a transmittance of α rays of 0.001 count/h or less, even in a case of having a thickness of 1 μm or less with respect to the layering direction D1 (that is, an optical axis direction).

In order to prevent α rays emitted from the cover substrate 13 from being incident on the photoelectric conversion element 12, the α-ray transmission preventive film 14 is preferably provided between the cover substrate 13 and the sensor substrate 11 (in particular, the photoelectric conversion element 12). The α-ray transmission preventive film 14 illustrated in FIG. 1 is arranged between the cover substrate 13 and the lower lens 22, and attached to the cover substrate 13 (in particular, the surface of the cover substrate 13 on the sensor substrate 11 side (that is, a surface directed to the sensor substrate 11)). The α-ray transmission preventive film 14 may be directly attached to the cover substrate 13, or may be attached to the cover substrate 13 via a bonding layer (not illustrated).

Note that an arrangement position of the α-ray transmission preventive film 14 in the imaging apparatus 10 is not limited to the position illustrated in FIG. 1. The α-ray transmission preventive film 14 can be arranged at any position upstream of the photoelectric conversion element 12 with respect to traveling of the image-capturing light L. That is, the α-ray transmission preventive film 14 can be arranged at any position as long as a part or all of the α rays can be removed from the image-capturing light L before being incident on the photoelectric conversion element 12.

Therefore, the α-ray transmission preventive film 14 may be provided between the on-chip lens 23 and the photoelectric conversion element 12 (see FIGS. 24A and 24B described later). For example, in a case where a color filter (not illustrated) is provided between the on-chip lens 23 and the photoelectric conversion element 12, the α-ray transmission preventive film 14 may be provided between the color filter and the on-chip lens 23 or between the color filter and the photoelectric conversion element 12.

Furthermore, the α-ray transmission preventive film 14 may be provided between the on-chip lens 23 and the cover substrate 13 (see FIGS. 25A to 25C described later). For example, the α-ray transmission preventive film 14 may be attached to a surface of the on-chip lens 23 on the cover substrate 13 side or a surface of the lower lens 22 on the sensor substrate 11 side.

Note that the α-ray transmission preventive film 14 may generate heat when the image-capturing light L is transmitted. Therefore, from the viewpoint of suppressing an influence of heat on a captured image, the α-ray transmission preventive film 14 is preferably provided at a position away from the photoelectric conversion element 12 (for example, the cover substrate 13 and/or the lower lens 22).

To a surface of the α-ray transmission preventive film 14 on the sensor substrate 11 side, an antireflection film 15 that suppresses reflection of light is attached. In the example illustrated in FIG. 1, the antireflection film 15 extends between the α-ray transmission preventive film 14 and the support body 30 and between the α-ray transmission preventive film 14 and the lower lens 22.

A material (a composition) of the antireflection film 15 and a formation method for the antireflection film 15 are not limited. The antireflection film 15 may contain one or both of an inorganic material ($SiO_2$, SiON, SiN, NbO, TiO, AlO, or the like) and an organic material (hollow silica particles or the like). Therefore, the antireflection film 15 may be, for example, an organic film having a refractive index of about 1.5, a material containing a high refractive index filler, or an inorganic film such as a silicon nitride film.

The antireflection film 15 may have a single layer structure or a multilayer structure (that is, a layered structure).

The installation location of the antireflection film 15 is not limited to the example illustrated in FIG. 1. From the viewpoint of suppressing reflection of light, it is preferable to provide the antireflection film 15 at each interface that can cause reflection of light.

In particular, by providing the antireflection film 15 at an interface between media having a large difference in refractive index at which light is easily reflected, it is possible to effectively suppress unintended reflection of light and to reduce generation of the stray light L1. For example, by arranging the antireflection film 15 at an interface between the gas layer 20 and a medium (each of the lower lens 22 and the on-chip lens 23 in the example illustrated in FIG. 1) adjacent to the gas layer 20, unintended reflection of light can be effectively suppressed.

Next, an example of an interface structure between the cover substrate 13 and the α-ray transmission preventive film 14 will be described.

Figure 2A:
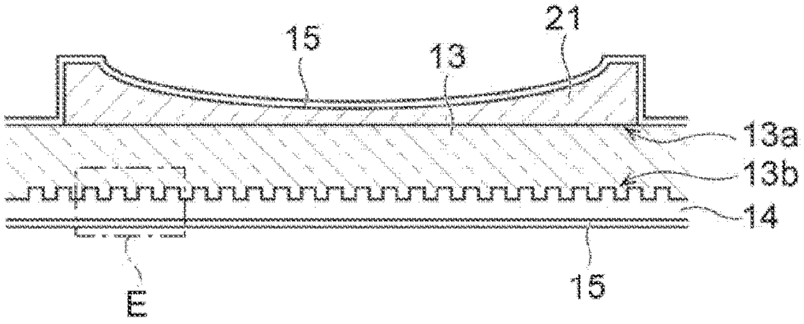
FIG. 2A is a cross-sectional view illustrating a first example of an interface structure between a cover substrate and an α-ray transmission preventive film.
Figure 2B:
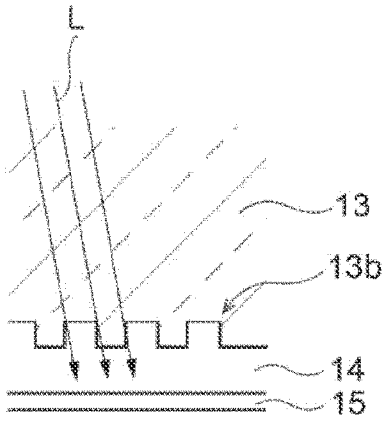
FIG. 2B is an enlarged view of a range indicated by a reference sign "E" in FIG. 2A.
Figure 3:
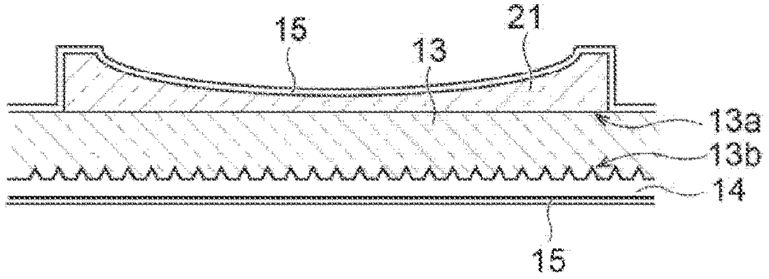
FIG. 3 is a cross-sectional view illustrating a second example of the interface structure between the cover substrate and the α-ray transmission preventive film.
Figure 4:
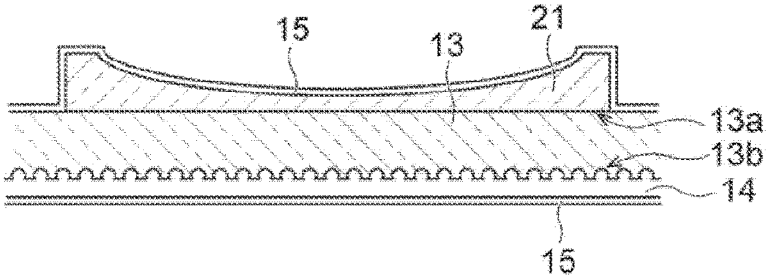
FIG. 4 is a cross-sectional view illustrating a third example of the interface structure between the cover substrate and the α-ray transmission preventive film.

FIG. 2A is a cross-sectional view illustrating a first example of an interface structure between the cover substrate 13 and the α-ray transmission preventive film 14. FIG. 2B is an enlarged view of a range indicated by a reference sign "E" in FIG. 2A. FIG. 3 is a cross-sectional view illustrating a second example of the interface structure between the cover substrate 13 and the α-ray transmission preventive film 14. FIG. 4 is a cross-sectional view illustrating a third example of the interface structure between the cover substrate 13 and the α-ray transmission preventive film 14.

The upper lens 21, the cover substrate 13, and the α-ray transmission preventive film 14 illustrated in each of FIGS. 2A to 4 have a layer structure similar to that of the example illustrated in FIG. 1.

However, in the example illustrated in each of FIGS. 2A to 4, the antireflection film 15 is provided not only on a surface of the α-ray transmission preventive film 14 on the sensor substrate 11 side but also on a surface of each of the upper lens 21 and the cover substrate 13 on a side opposite to the α-ray transmission preventive film 14. That is, the antireflection film 15 is also attached to a surface of the upper lens 21 on a side opposite to the cover substrate 13.

In FIG. 1, a surface of the cover substrate 13 on the sensor substrate 11 side is drawn as a flat surface, but the surface of the cover substrate 13 on the sensor substrate 11 side (a lower surface in FIGS. 2A to 4) may have an uneven shape.

The cover substrate 13 illustrated in FIGS. 2A and 2B has an uneven surface 13*b* including a recess having a rectangular cross section. The cover substrate 13 illustrated in FIG. 3 has an uneven surface 13*b* including a recess having a triangular cross section. The cover substrate 13 illustrated in FIG. 4 has an uneven surface 13*b* including a recess having a circular cross section (strictly, a cross section having a shape of a part of a circle). Furthermore, although not illustrated, the surface of the cover substrate 13 on the sensor substrate 11 side may be a rough surface having a random uneven shape. Note that a surface 13*a* of the cover substrate 13 to which the upper lens 21 is attached has a flat shape in the example illustrated in FIGS. 2A to 4, but may have an uneven shape.

The α-ray transmission preventive film 14 illustrated in each of FIGS. 2A to 4 is attached to the uneven surface 13*b* of the cover substrate 13 on the sensor substrate 11 side. That is, a surface of the α-ray transmission preventive film 14 on the cover substrate 13 side (an upper surface in FIGS. 2A to 4) has an uneven shape conforming to the uneven surface 13*b* of the cover substrate 13. Therefore, the surface of the α-ray transmission preventive film 14 on the cover substrate 13 side is in close contact with the uneven surface 13*b* of the cover substrate 13 on the sensor substrate 11 side without any gap.

In a case where an interface between the α-ray transmission preventive film 14 and the cover substrate 13 has the uneven structure as described above, an optical path length in the α-ray transmission preventive film 14 can be lengthened by refraction of the image-capturing light L at the interface. As a result, α ray non-transmission efficiency (that is, efficiency of removing the α ray) in the α-ray transmission preventive film 14 can be improved.

Even in a case where the α-ray transmission preventive film 14 is attached to a member other than the cover substrate 13, the α ray non-transmission efficiency in the α-ray transmission preventive film 14 can be improved when the interface between the α-ray transmission preventive film 14 and the member to which the α-ray transmission preventive film 14 is attached has an uneven structure.

Next, an example of a manufacturing method for an imaging apparatus 10 will be described.

FIGS. 5 to 14 are cross-sectional views illustrating an example of a manufacturing method for the imaging apparatus 10.

The imaging apparatus 10 (see FIG. 14) manufactured by the manufacturing method of the present example has a structure similar to that of the imaging apparatus 10 illustrated in FIG. 1. However, in the imaging apparatus 10 manufactured by the manufacturing method of the present example, the antireflection film 15 is attached to a surface of each of the upper lens 21 and the cover substrate 13 on a side opposite to the sensor substrate 11, between the support body 30 and the α-ray transmission preventive film 14, and a surface of the lower lens 22 on the sensor substrate 11 side.

Figure 5:
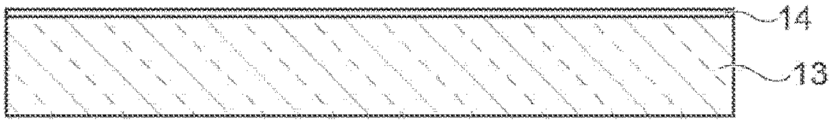
FIG. 5 is a cross-sectional view illustrating an example of a manufacturing method for an imaging apparatus.

In the present manufacturing method example, first, as illustrated in FIG. 5, the α-ray transmission preventive film 14 is applied to an entire surface of the cover substrate 13.

A method of applying the α-ray transmission preventive film 14 is not limited. For example, by using a spin coating method, a dipping method, a method using a squeegee, an inkjet method, or a vapor deposition method, a constituent material of the α-ray transmission preventive film 14 can be applied to the cover substrate 13. The constituent material of the α-ray transmission preventive film 14 may be fixed to the cover substrate 13 by natural drying, or the fixing to the cover substrate 13 may be promoted by heating or ultraviolet irradiation in a case where thermal curing characteristics or UV curing characteristics is provided.

Figure 6:
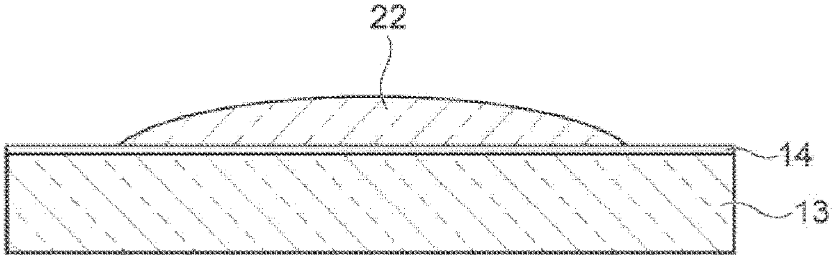
FIG. 6 is a cross-sectional view illustrating an example of the manufacturing method for the imaging apparatus.

Next, as illustrated in FIG. 6, the lower lens 22 is attached onto the α-ray transmission preventive film 14.

Note that, as in the imaging apparatus 10 illustrated in FIG. 1, in a case where the antireflection film 15 is provided between the α-ray transmission preventive film 14 and the lower lens 22, the antireflection film 15 is applied onto the α-ray transmission preventive film 14 prior to the formation of the lower lens 22.

The lower lens 22 can be formed by any method. The lower lens 22 may be formed by applying a constituent material of the lower lens 22 onto the α-ray transmission preventive film 14 and molding the constituent material. For example, the lower lens 22 can be formed on the α-ray transmission preventive film 14 by using an imprint method, a grayscale patterning (grayscale lithography) method, a reflow method, or a combination of the reflow method and an etch back method. Alternatively, the lower lens 22 formed in advance may be bonded to the α-ray transmission preventive film 14 via a bonding layer (not illustrated).

Figure 7:
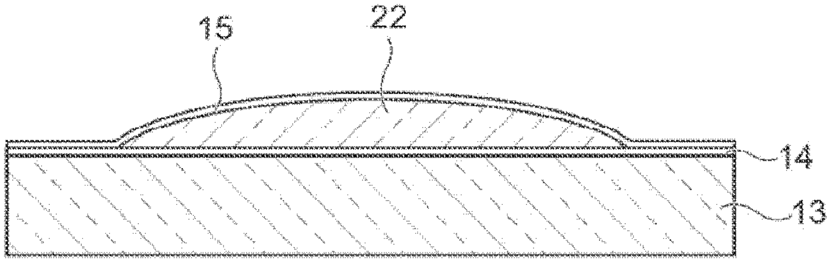
FIG. 7 is a cross-sectional view illustrating an example of the manufacturing method for the imaging apparatus.

Next, as illustrated in FIG. 7, the antireflection film 15 is applied onto the α-ray transmission preventive film 14 and the lower lens 22. The antireflection film 15 can be provided on the α-ray transmission preventive film 14 and the lower lens 22 by any method.

Figure 8:
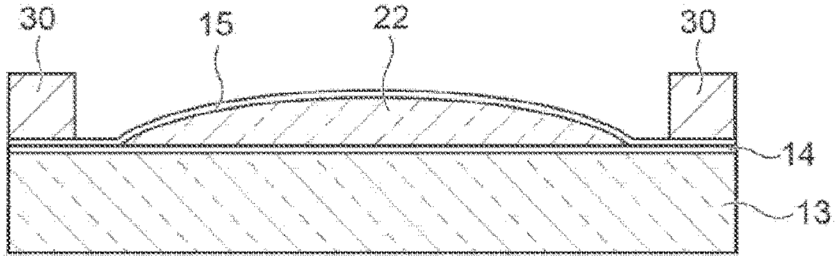
FIG. 8 is a cross-sectional view illustrating an example of the manufacturing method for the imaging apparatus.

Next, as illustrated in FIG. 8, the support body 30 is applied onto the α-ray transmission preventive film 14.

The support body 30 can be provided on the α-ray transmission preventive film 14 by any method. For example, the support body 30 may be formed by applying a material constituting the support body 30 onto the α-ray transmission preventive film 14, and thereafter, performing patterning (for example, resist patterning) to leave only a portion located on an outer peripheral portion of the α-ray transmission preventive film 14. In a case where the support body 30 includes a plurality of constituent layers, adjacent constituent layers may be fixed to each other with a thin adhesive layer (for example, an adhesive of about 1 to 500 nm) interposed therebetween.

The support body 30 of the present example is formed in a first layered body including the cover substrate 13, but may be formed in a second layered body including the layered substrate 41 (the sensor substrate 11 and the logic substrate 40).

Figure 9:
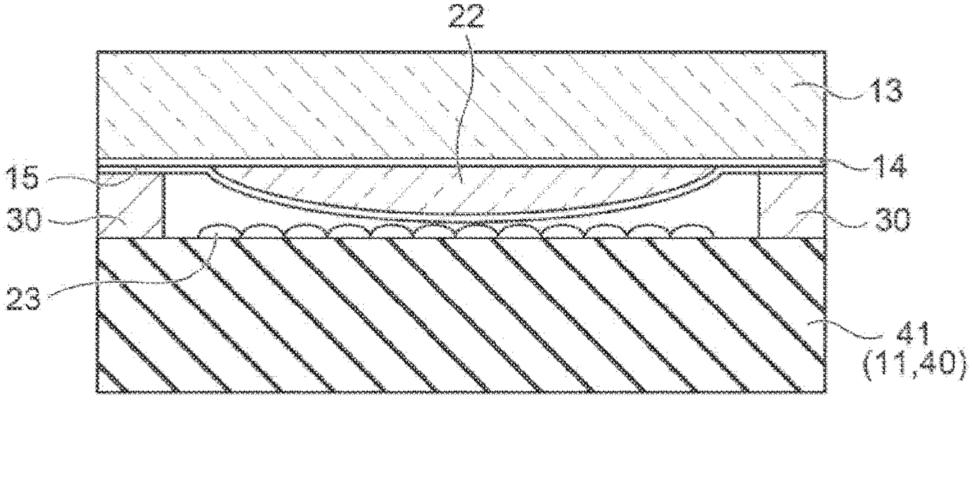
FIG. 9 is a cross-sectional view illustrating an example of the manufacturing method for the imaging apparatus.

Next, as illustrated in FIG. 9, the first layered body (the cover substrate 13, the α-ray transmission preventive film 14, the antireflection film 15, the lower lens 22, and the support body 30) is bonded to the second layered body (the layered substrate 41 and the on-chip lens 23).

A bonding method of the first layered body and the second layered body is not limited. In a case where the support body 30 exhibits favorable adhesion to the first layered body (the antireflection film 15 in the present example), the first layered body and the second layered body may be bonded by directly fixing the support body 30 to the first layered body. Alternatively, the first layered body and the second layered body may be bonded via an adhesive layer (not illustrated).

Figure 10:
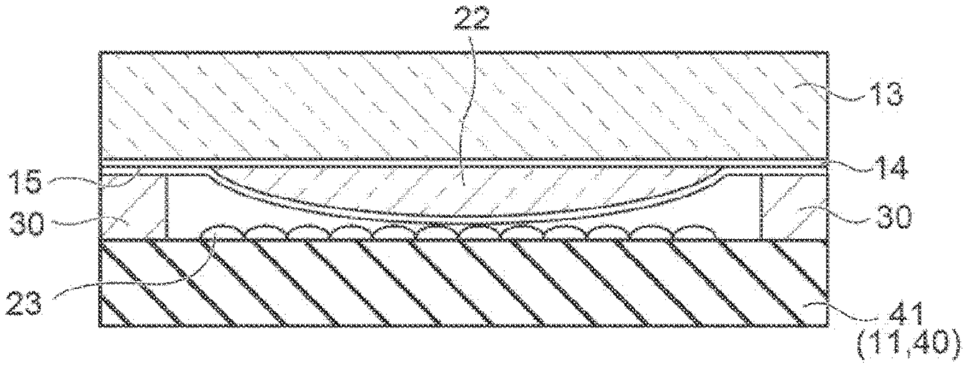
FIG. 10 is a cross-sectional view illustrating an example of the manufacturing method for the imaging apparatus.

Next, as illustrated in FIG. 10, the layered substrate 41 is partially removed, and the layered substrate 41 is thinned. The layered substrate 41 can be thinned by any method.

Figure 11:
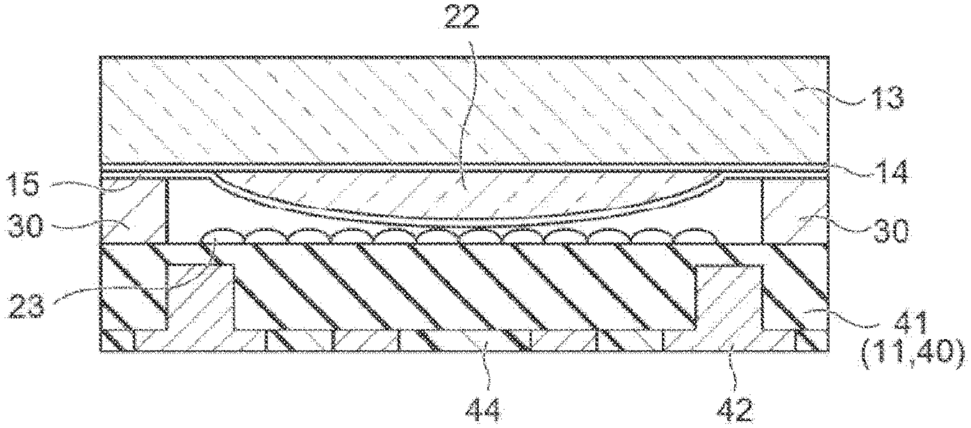
FIG. 11 is a cross-sectional view illustrating an example of the manufacturing method for the imaging apparatus.

Next, as illustrated in FIG. 11, the wiring electrode 42 is formed on the layered substrate 41, and the solder resist 44 covering a back surface of the layered substrate 41 is formed.

Figure 12:
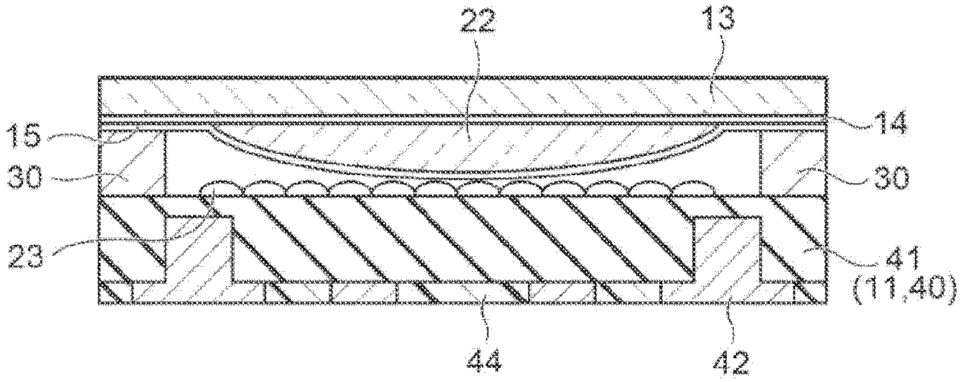
FIG. 12 is a cross-sectional view illustrating an example of the manufacturing method for the imaging apparatus.

Next, as illustrated in FIG. 12, the cover substrate 13 is partially removed, and the cover substrate 13 is thinned. The cover substrate 13 can be thinned by any method.

Figure 13:
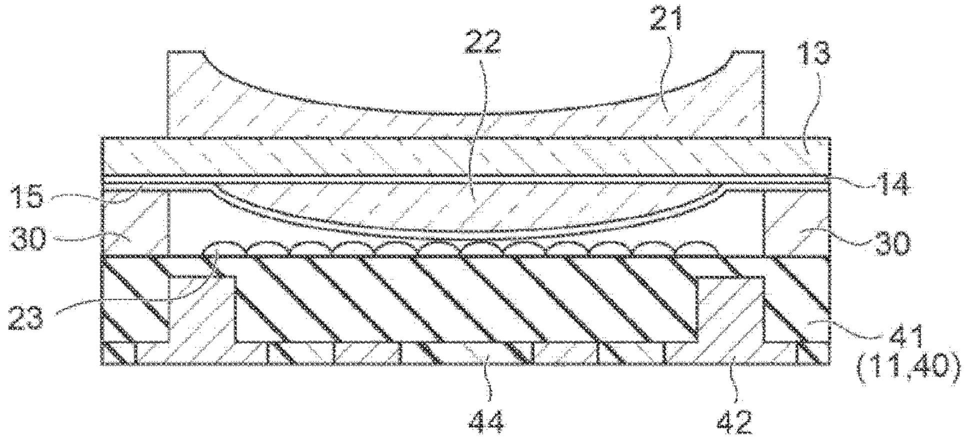
FIG. 13 is a cross-sectional view illustrating an example of the manufacturing method for the imaging apparatus.

Next, as illustrated in FIG. 13, the upper lens 21 is provided on the cover substrate 13.

Note that, in a case where a light shielding body such as an aperture (for example, a black resist or a patterned metal film) is formed on the cover substrate 13 (see FIG. 29 described later), such a light shielding body may be formed on the cover substrate 13 prior to the formation of the upper lens 21.

The upper lens 21 can be provided on the cover substrate 13 by a method similar to that of the lower lens 22 described above. The upper lens 21 may be formed by applying a constituent material of the upper lens 21 onto the cover substrate 13 and molding the constituent material. Alternatively, the preformed upper lens 21 may be bonded to the cover substrate 13 directly or via a bonding layer.

Figure 14:
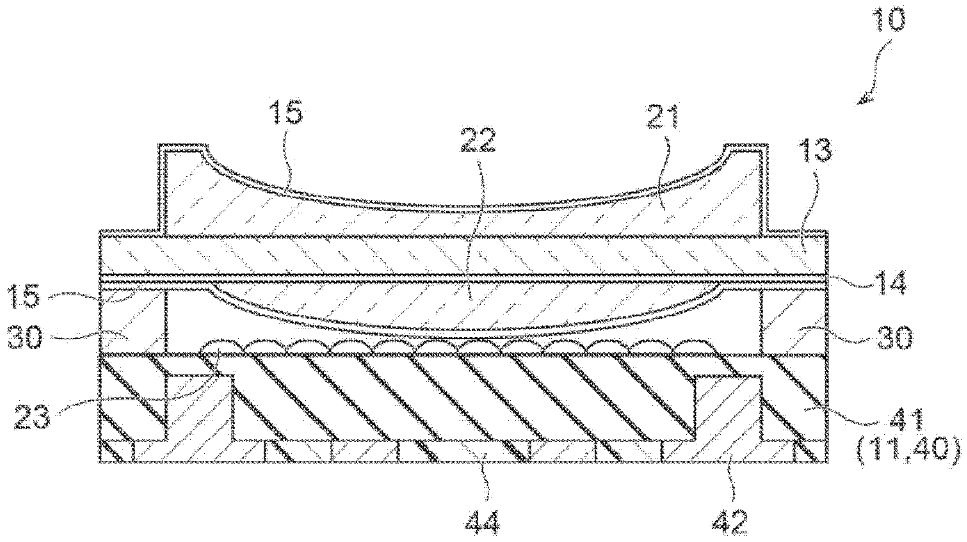
FIG. 14 is a cross-sectional view illustrating an example of the manufacturing method for the imaging apparatus.

Then, as illustrated in FIG. 14, the antireflection film 15 is provided on the upper lens 21 and the cover substrate 13.

The imaging apparatus 10 of the wafer-level CSP-type formed through the above-described series of steps is then diced to form a plurality of bare chips.

As described above, the manufacturing method of the present example includes a step of preparing the first layered body including the cover substrate 13 and the α-ray transmission preventive film 14 (see FIGS. 5 to 8) and a step of preparing the second layered body including the sensor substrate 11 (the layered substrate 41). Then, the manufacturing method further includes a step of layering the first layered body and the second layered body such that the α-ray transmission preventive film 14 is located between the cover substrate 13 and the sensor substrate 11 (see FIG. 9).

Second Embodiment

In the present embodiment, elements same as or similar to those in the first embodiment described above are denoted by the same reference numerals, and the detailed description thereof will be omitted.

The imaging apparatus of the present embodiment does not include the lower lens 22.

Figure 15:
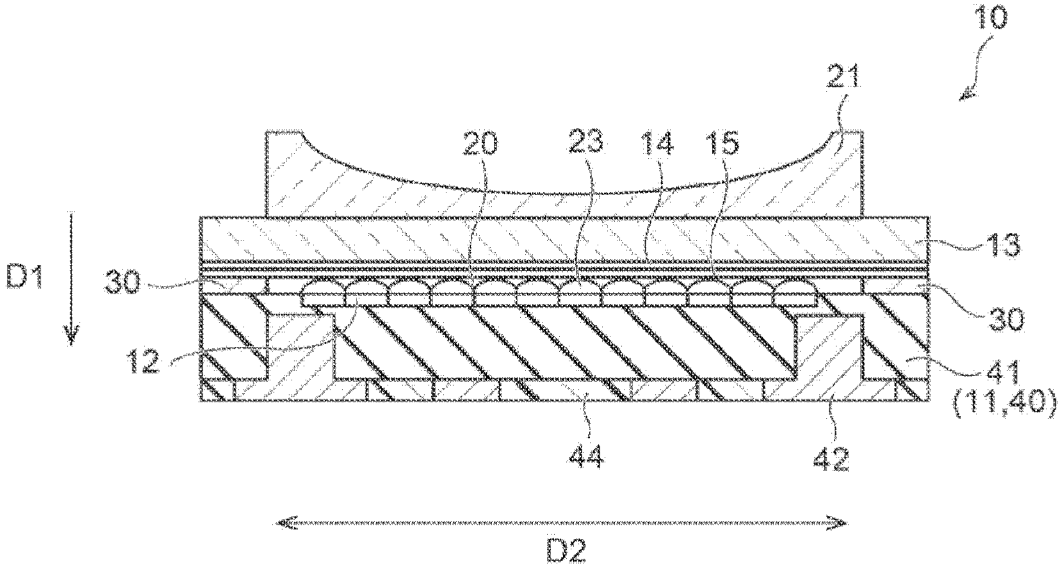
FIG. 15 is a view schematically illustrating a cross-sectional structure of an imaging apparatus according to an example of a second embodiment.

FIG. 15 is a view schematically illustrating a cross-sectional structure of an imaging apparatus 10 according to an example of a second embodiment.

The imaging apparatus 10 illustrated in FIG. 15 has a configuration similar to that of the imaging apparatus 10 illustrated in FIG. 1 described above, but does not include the lower lens 22.

According to the imaging apparatus 10 of the present example, a thickness of a gas layer 20 in a layering direction D1 can be further reduced, and a cover substrate 13 can be brought close to a sensor substrate 11 (in particular, a photoelectric conversion element 12).

As a result, it is possible to promote miniaturization (that is, reduction in height) of a size of the imaging apparatus 10 in the layering direction D1.

Next, an example of a manufacturing method for an imaging apparatus 10 will be described.

FIGS. 16 to 23 are cross-sectional views illustrating an example of a manufacturing method for the imaging apparatus 10. The imaging apparatus 10 (see FIG. 23) manufactured by the manufacturing method of the present example has a structure similar to that of the imaging apparatus 10 illustrated in FIG. 15.

Figure 16:
FIG. 16 is a cross-sectional view illustrating an example of a manufacturing method for an imaging apparatus.

In the present manufacturing method example, first, as illustrated in FIG. 16, an α-ray transmission preventive film 14 is applied onto a surface of the cover substrate 13.

Figure 17:
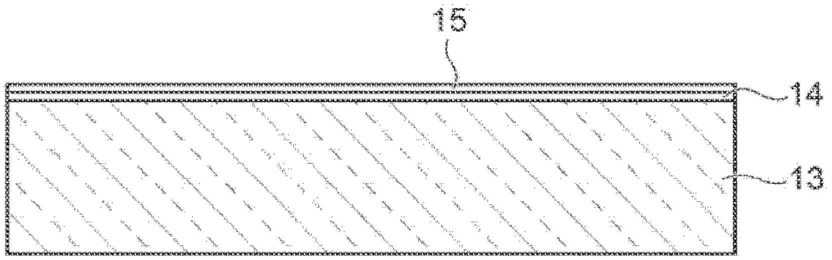
FIG. 17 is a cross-sectional view illustrating an example of the manufacturing method for the imaging apparatus.
Figure 18:
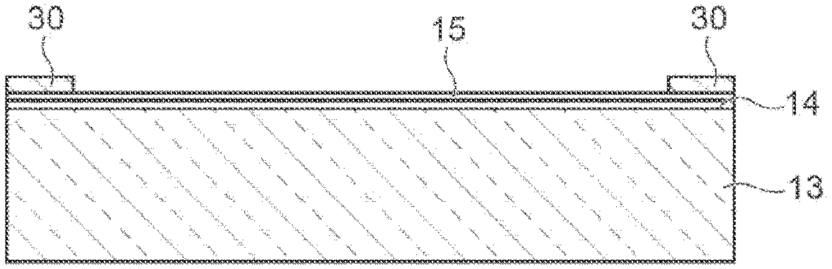
FIG. 18 is a cross-sectional view illustrating an example of the manufacturing method for the imaging apparatus.

Thereafter, an antireflection film 15 is applied onto the α-ray transmission preventive film 14 as illustrated in FIG. 17, and a support body 30 is applied onto the antireflection film 15 as illustrated in FIG. 18.

Figure 19:
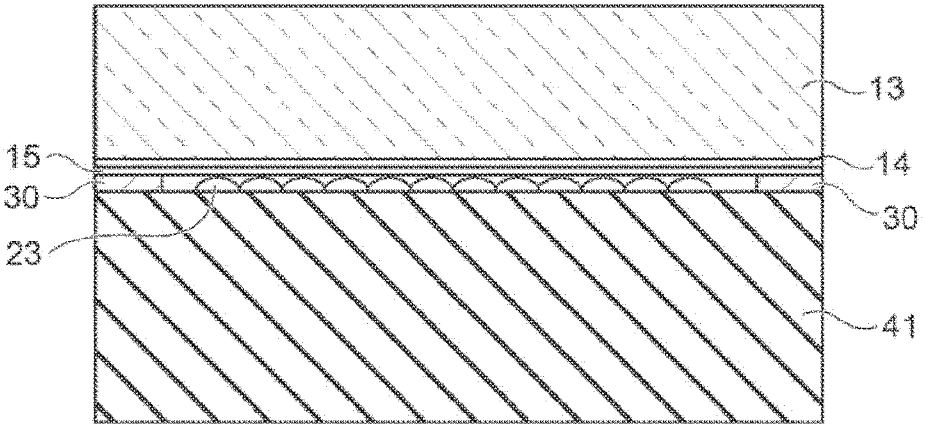
FIG. 19 is a cross-sectional view illustrating an example of the manufacturing method for the imaging apparatus.

Thereafter, as illustrated in FIG. 19, a first layered body (the cover substrate 13, the α-ray transmission preventive film 14, the antireflection film 15, and the support body 30) is bonded to a second layered body (a layered substrate 41 and an on-chip lens 23) with the support body 30 interposed therebetween.

Figure 20:
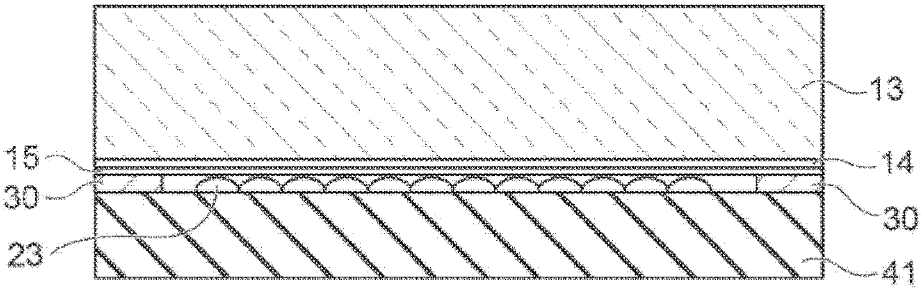
FIG. 20 is a cross-sectional view illustrating an example of the manufacturing method for the imaging apparatus.
Figure 21:
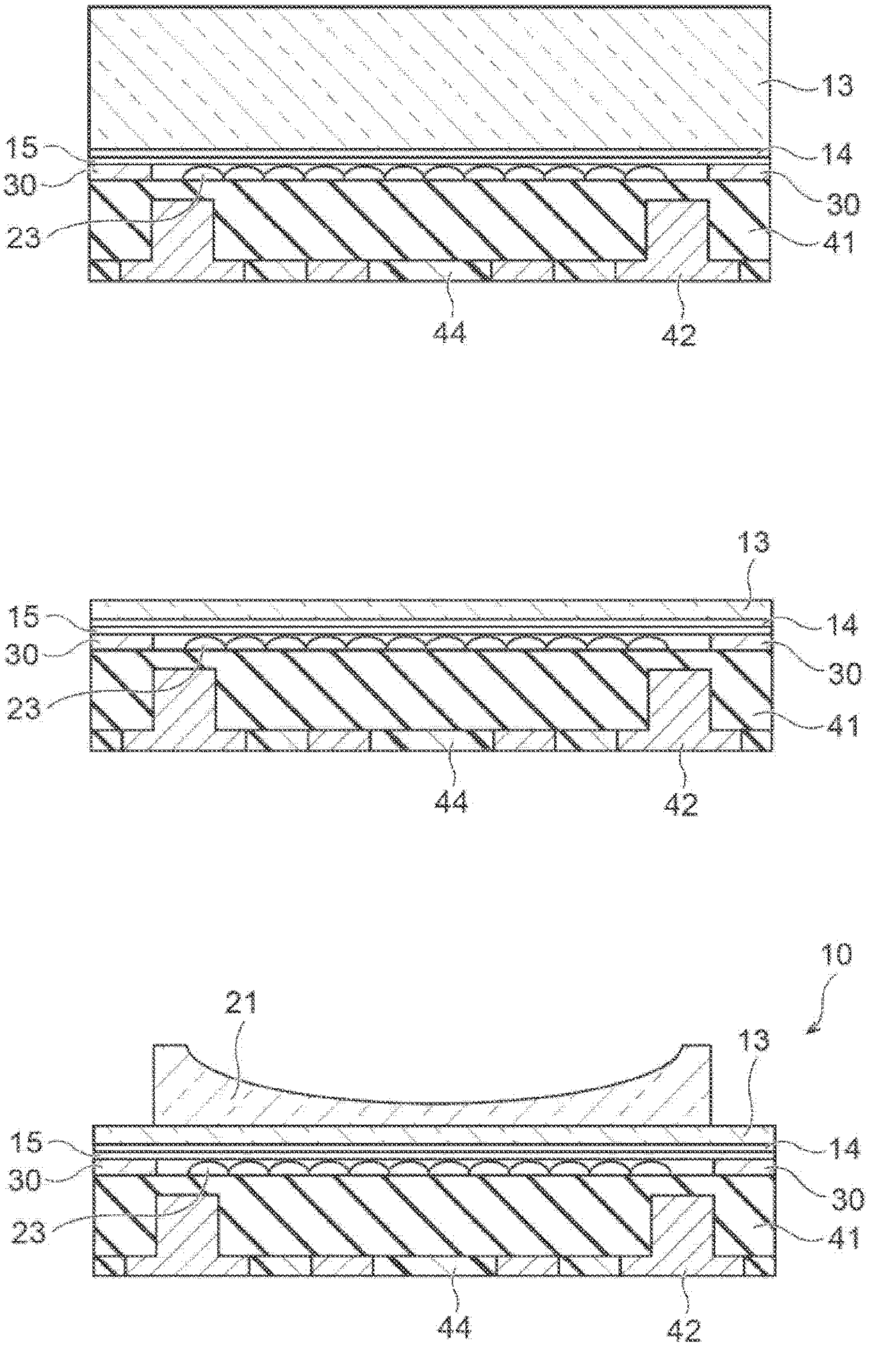
FIG. 21 is a cross-sectional view illustrating an example of the manufacturing method for the imaging apparatus.
Figure 22:
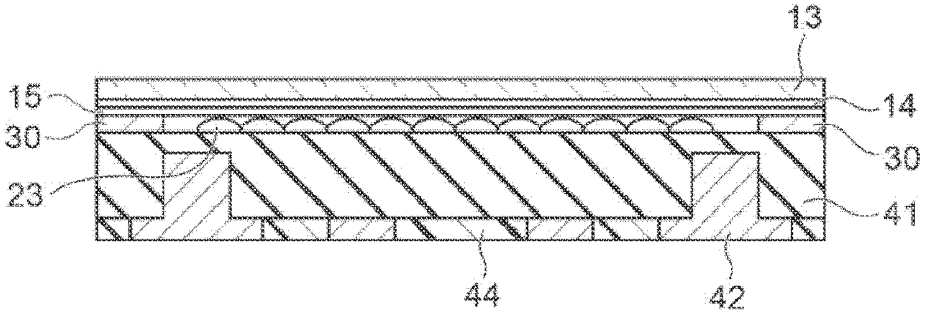
FIG. 22 is a cross-sectional view illustrating an example of the manufacturing method for the imaging apparatus.

Thereafter, the layered substrate 41 is thinned as illustrated in FIG. 20, a wiring electrode 42 and a solder resist 44 are provided on the layered substrate 41 as illustrated in FIG. 21, and the cover substrate 13 is thinned as illustrated in FIG. 22.

Figure 23:
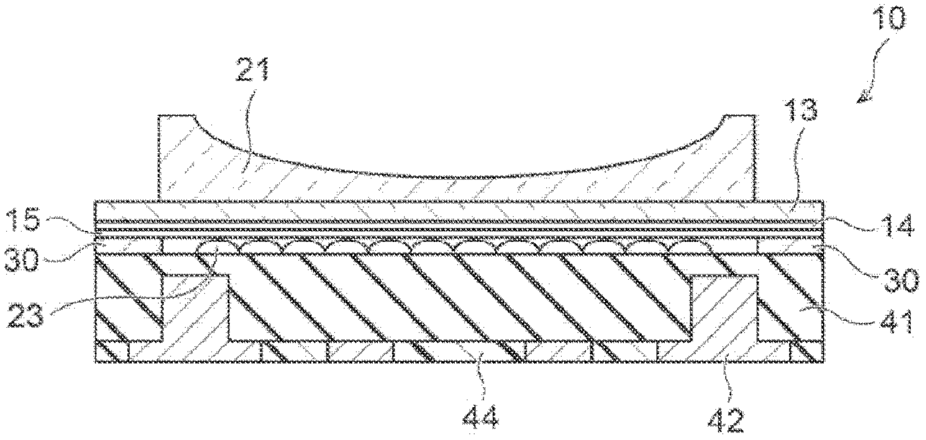
FIG. 23 is a cross-sectional view illustrating an example of the manufacturing method for the imaging apparatus.

Then, as illustrated in FIG. 23, an upper lens 21 is provided on the cover substrate 13.

Thereafter, the imaging apparatus 10 of the wafer-level CSP-type formed through the above-described series of steps is diced to form a plurality of bare chips.

Figure 24A:
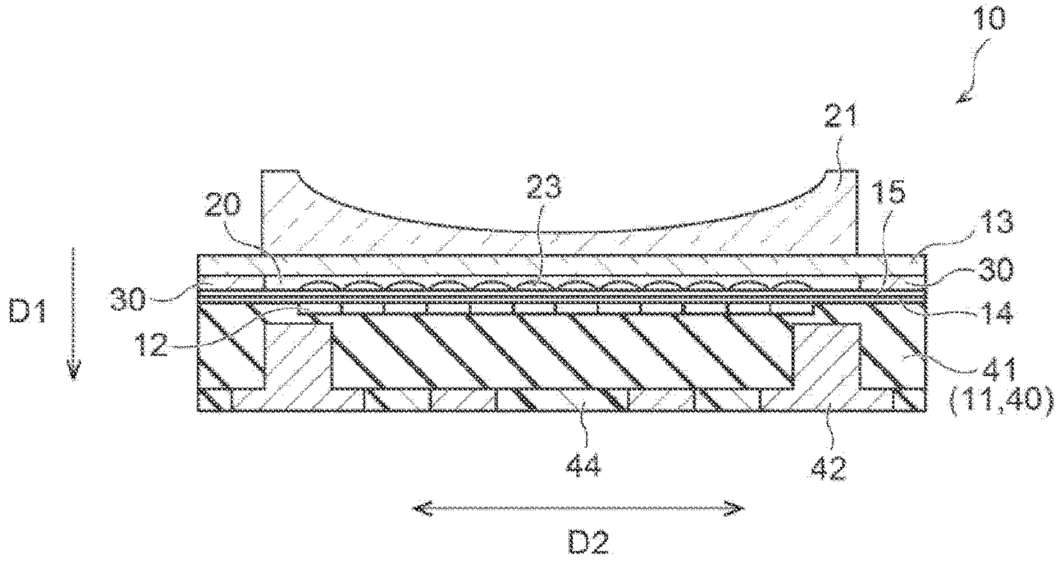
FIG. 24A is a view schematically illustrating a cross-sectional structure of an imaging apparatus according to another example of the second embodiment.

FIG. 24A is a view schematically illustrating a cross-sectional structure of the imaging apparatus 10 according to another example of the second embodiment. FIG. 24B is an enlarged view of a part of the imaging apparatus 10 illustrated in FIG. 24A.

The α-ray transmission preventive film 14 may be provided so as to be located between the on-chip lens 23 and the sensor substrate 11.

Figure 24B:
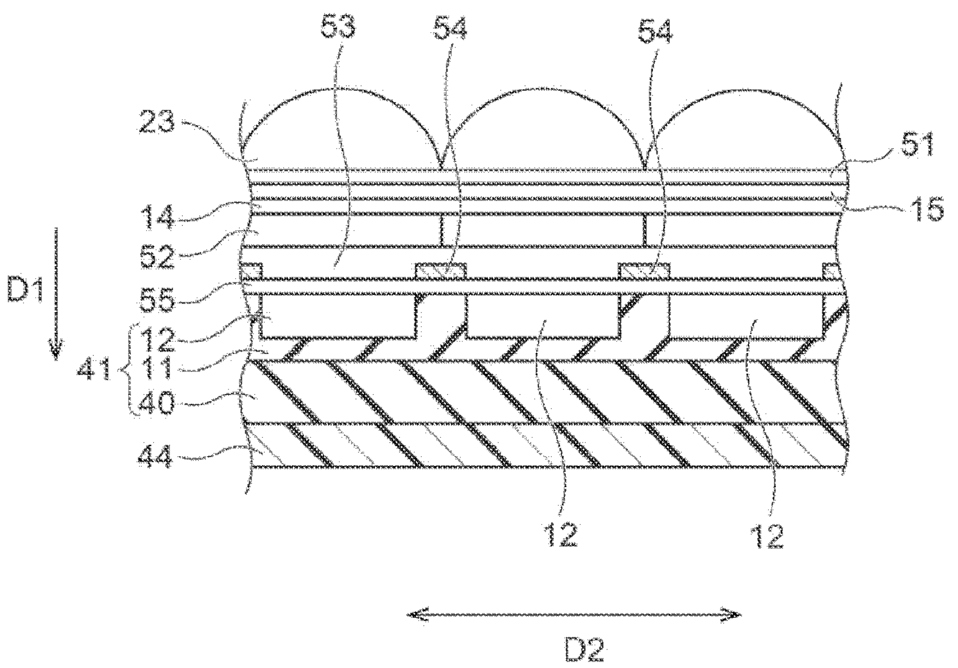
FIG. 24B is an enlarged view of a part of the imaging apparatus illustrated in FIG. 24A.

In the example illustrated in FIGS. 24A and 24B, the α-ray transmission preventive film 14 and the antireflection film 15 are provided between the on-chip lens 23 and the sensor substrate 11 (the photoelectric conversion element 12). The α-ray transmission preventive film 14 is located on the sensor substrate 11 side, and the antireflection film 15 is located on the on-chip lens 23 side.

More specifically, as illustrated in FIG. 24B, a protective film 55, a light shielding film 54, a planarization film 53, a color filter layer 52, the α-ray transmission preventive film 14, the antireflection film 15, an organic material layer 51, and the on-chip lens 23 are sequentially layered on the sensor substrate 11.

The protective film 55 is a member for protecting the photoelectric conversion element 12, and can contain, for example, silicon dioxide (SiO2). The light shielding film 54 is located between the adjacent photoelectric conversion elements 12 in a layer extending direction D2, and prevents light from leaking into the adjacent photoelectric conversion elements 12. The planarization film 53 planarizes a region where the color filter layer 52 is formed. The color filter layer 52 includes a plurality of color filters provided for every photoelectric conversion element 12. The organic material layer 51 functions as an adhesive layer, and can contain, for example, an acrylic resin material, a styrene resin material, or an epoxy resin material.

Figure 25A:
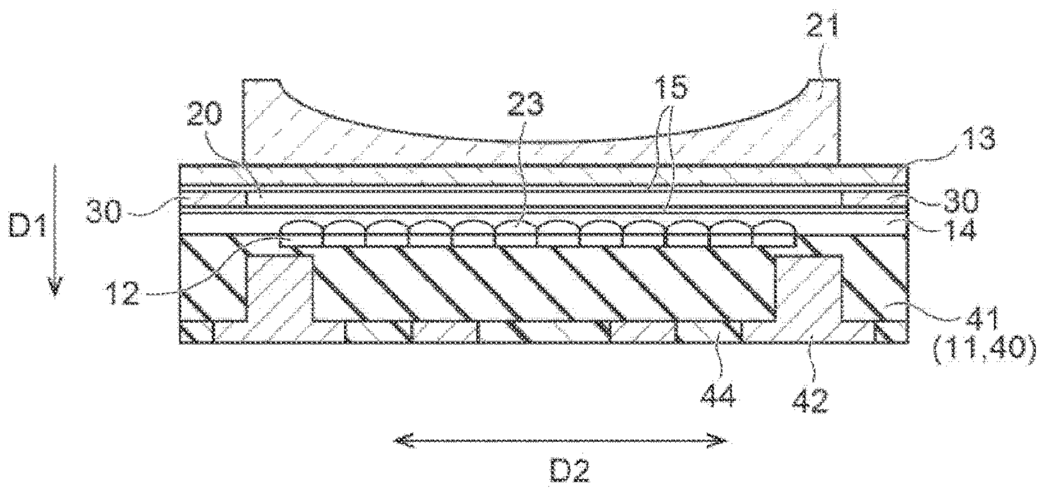
FIG. 25A is a view schematically illustrating a cross-sectional structure of an imaging apparatus according to another example of the second embodiment.

FIG. 25A is a view schematically illustrating a cross-sectional structure of the imaging apparatus 10 according to another example of the second embodiment. FIG. 25B corresponds to a part of the imaging apparatus 10 illustrated in FIG. 25A, and illustrates the α-ray transmission preventive film 14 and the antireflection film 15 of a first form. FIG. 25C corresponds to a part of the imaging apparatus 10 illustrated in FIG. 25A, and illustrates the α-ray transmission preventive film 14 and the antireflection film 15 of a second form.

The α-ray transmission preventive film 14 may be located on a side opposite to the sensor substrate 11 via the on-chip lens 23.

Figure 25B:
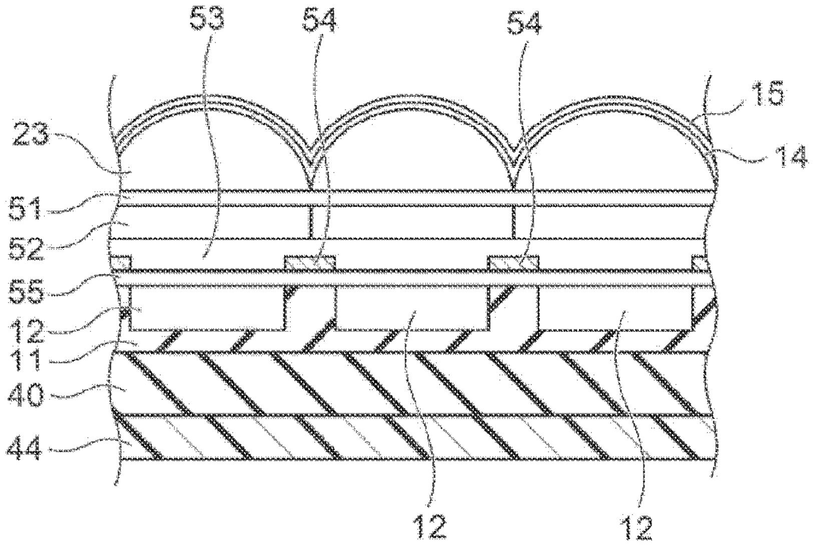
FIG. 25B corresponds to a part of the imaging apparatus illustrated in FIG. 25A, and illustrates an α-ray transmission preventive film and an antireflection film of a first form.
Figure 25C:
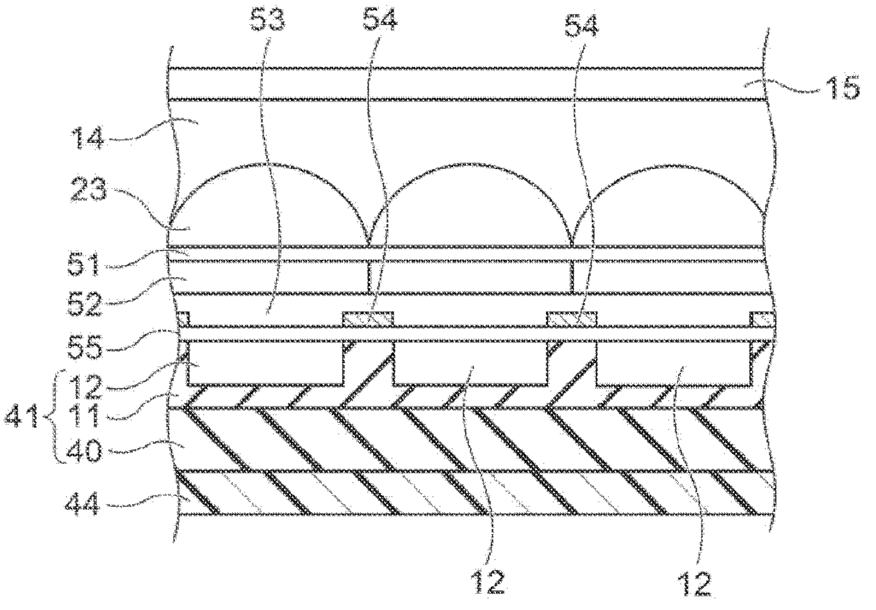
FIG. 25C corresponds to a part of the imaging apparatus illustrated in FIG. 25A, and illustrates the α-ray transmission preventive film and the antireflection film of a second form.

In the example illustrated in FIGS. 25A to 25C, the α-ray transmission preventive film 14 and the antireflection film 15 are provided so as to cover the layered substrate 41 (in particular, a surface of the sensor substrate 11 on the cover substrate 13 side) and the on-chip lenses 23. Here, the α-ray transmission preventive film 14 is located on the layered substrate 41 side, and the antireflection film 15 is located on the cover substrate 13 side and adjacent to the gas layer 20. In the example illustrated in FIGS. 25A to 25C, the antireflection film 15 is also attached to a surface of the cover substrate 13 on the sensor substrate 11 side.

The support body 30 is attached to the cover substrate 13 via the antireflection film 15, and is attached to the layered substrate 41 (in particular, the sensor substrate 11) via the antireflection film 15 and the α-ray transmission preventive film 14.

A specific layering form of the α-ray transmission preventive film 14 and the antireflection film 15 on the on-chip lens 23 and the layered substrate 41 is not limited.

As illustrated in FIG. 25B, each of the α-ray transmission preventive film 14 and the antireflection film 15 may have a substantially uniform thickness and extend on the on-chip lens 23 and the layered substrate 41 (in particular, the sensor substrate 11). In this case, the α-ray transmission preventive film 14 and the antireflection film 15 on the on-chip lens 23 have a curved shape corresponding to a shape of a curved surface of the on-chip lens 23 on the cover substrate 13 side.

Furthermore, as illustrated in FIG. 25C, the antireflection film 15 may be provided on a flat surface of the α-ray transmission preventive film 14. That is, the α-ray transmission preventive film 14 may form a flat surface extending in the layer extending direction D2 above the on-chip lens 23, and the antireflection film 15 may be fixed on the flat surface.

In a case where the antireflection film 15 is provided on the flat surface of the α-ray transmission preventive film 14 (see FIG. 25C), the antireflection film 15 tends to be easily formed with high accuracy, as compared with a case where the antireflection film 15 is provided on the curved surface of the α-ray transmission preventive film 14 (see FIG. 25B).

In a case where the α-ray transmission preventive film 14 is provided between the gas layer 20 and the sensor substrate 11 as illustrated in FIGS. 24A to 25C described above, the imaging apparatus 10 can be manufactured by the following manufacturing method.

That is, the present manufacturing method example includes a step of preparing a first layered body including the cover substrate 13 and a step of preparing a second layered body including the sensor substrate 11 and the α-ray transmission preventive film 14. The present manufacturing method includes a step of layering the first layered body and the second layered body such that the α-ray transmission preventive film 14 is located between the cover substrate 13 and the sensor substrate 11.

Next, a configuration example of the support body 30 will be described with reference to FIGS. 26 to 29.

An imaging apparatus 10 illustrated in each of FIGS. 26 to 29 has a configuration similar to that of the imaging apparatus 10 illustrated in FIG. 15, but the support body 30 illustrated in each of FIGS. 26 to 29 has a specific configuration.

Figure 26:
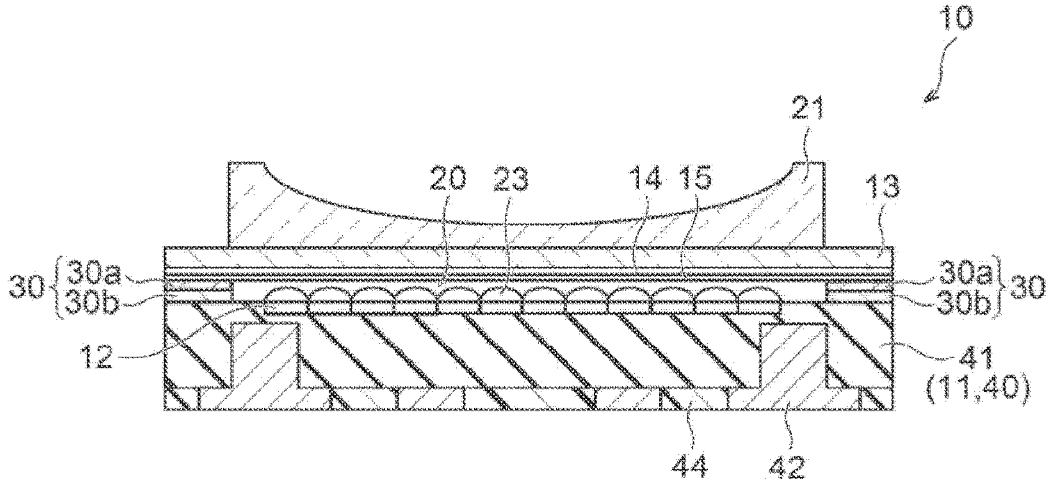
FIG. 26 is a view schematically illustrating a cross-sectional structure of an imaging apparatus according to another example of the second embodiment.

FIG. 26 is a view schematically illustrating a cross-sectional structure of the imaging apparatus 10 according to another example of the second embodiment.

The support body 30 may include a plurality of structures, and these structures may have a layered structure in which the structures are stacked on each other.

The support body 30 illustrated in FIG. 26 has a first support structure 30*a* and second support structure 30*b* stacked on each other. The first support structure 30*a* and the second support structure 30*b* may be directly bonded to each other, or may be bonded to each other via a thin adhesive layer (not illustrated).

The first support structure 30*a* and second support structure 30*b* may contain different materials, or may contain a mutually same material. For example, the first support structure 30*a* and the second support structure 30*b* may contain materials (an organic film and an inorganic film (including an inorganic oxide film, a nitride film, a metal film, and the like)) having mutually different functional characteristics. Such functional characteristics include mechanical characteristics (for example, rigidity), water resistance (moisture impermeability), hygroscopicity, light non-transmissibility, sealability, and any other characteristics.

Figure 27:
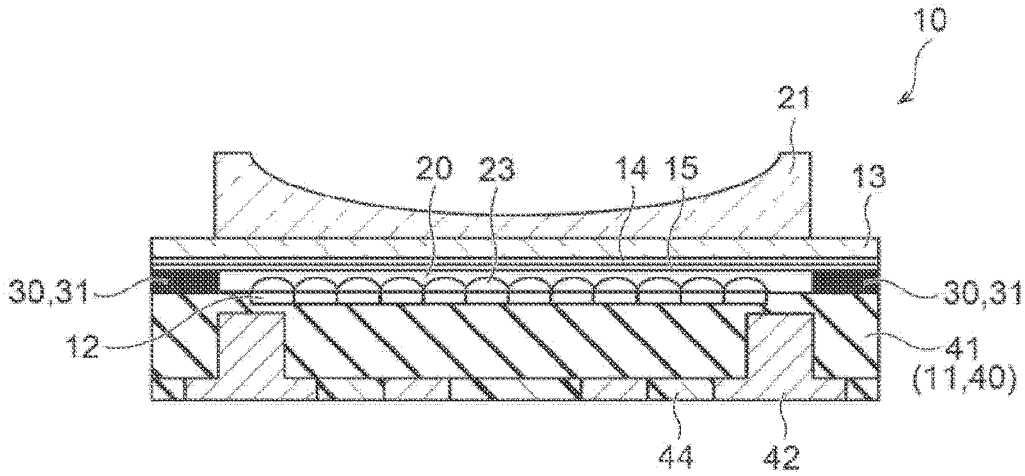
FIG. 27 is a view schematically illustrating a cross-sectional structure of an imaging apparatus according to another example of the second embodiment.

FIG. 27 is a view schematically illustrating a cross-sectional structure of the imaging apparatus 10 according to another example of the second embodiment.

The support body 30 may partially or entirely include a light shielding part 31.

The support body 30 illustrated in FIG. 27 entirely contains a material (for example, black resin) having light shielding performance. According to the support body 30 of the present example, it is possible to prevent stray light from being incident on the photoelectric conversion element 12 and to suppress occurrence of a flare in a captured image.

Figure 28:
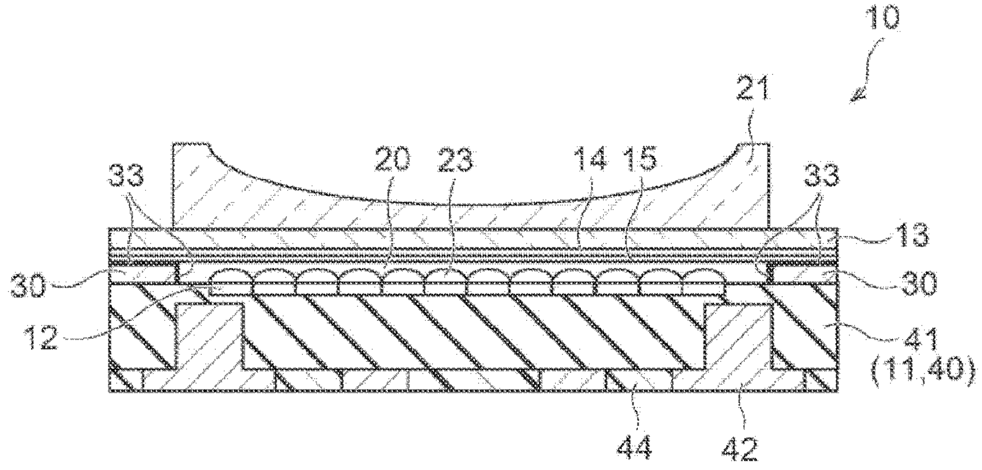
FIG. 28 is a view schematically illustrating a cross-sectional structure of an imaging apparatus according to another example of the second embodiment.

FIG. 28 is a view schematically illustrating a cross-sectional structure of the imaging apparatus 10 according to another example of the second embodiment.

To the support body 30, an attachment body having various functional characteristics may be attached.

A light shielding body (for example, a metal film) 33 is attached to the support body 30 illustrated in FIG. 28. In the example illustrated in FIG. 28, the light shielding body 33 is attached to a surface of the support body 30 on the cover substrate 13 side and a side surface of the support body 30 (in particular, a surface directed to the gas layer 20).

Figure 29:
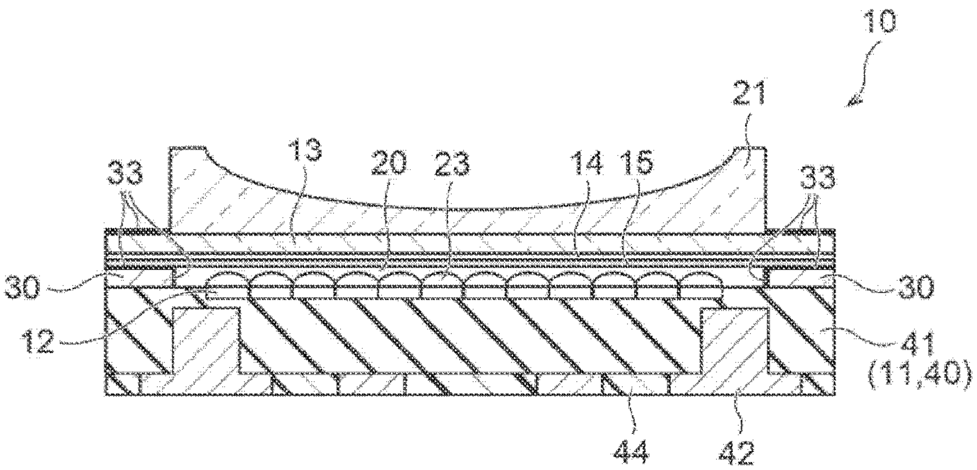
FIG. 29 is a view schematically illustrating a cross-sectional structure of an imaging apparatus according to another example of the second embodiment.

FIG. 29 is a view schematically illustrating a cross-sectional structure of the imaging apparatus 10 according to another example of the second embodiment.

The light shielding body 33 may be attached to a portion of the cover substrate 13 outside a portion facing the photoelectric conversion element 12.

In the example illustrated in FIG. 29, the light shielding body 33 is provided to surround the upper lens 21 on an outer peripheral portion of a surface of the cover substrate 13 to which the upper lens 21 is attached. Note that the light shielding body 33 may be attached to a surface of the cover substrate 13 on the sensor substrate 11 side (not illustrated).

Note that a structure related to the α-ray transmission preventive film 14 and the support body 30 disclosed in FIGS. 24A to 29 is applicable not only to the imaging apparatus 10 not having the lower lens 22 but also to the imaging apparatus 10 having the lower lens 22 (the imaging apparatus 10 of the first embodiment described above).

As described above, according to the imaging apparatus 10 of each of the above-described embodiments, since the image-capturing light L is incident on the photoelectric conversion element 12 after passing through the α-ray transmission preventive film 14, the image-capturing light L in a state where α rays are reduced by the α-ray transmission preventive film 14 can be made incident on the photoelectric conversion element 12.

In particular, since the α-ray transmission preventive film 14 is arranged between the cover substrate 13 and the sensor substrate 11 (in particular, the photoelectric conversion element 12), the α ray emitted from the cover substrate 13 can also be removed from the image-capturing light L by the α-ray transmission preventive film 14.

As described above, since the imaging apparatus 10 includes the α-ray transmission preventive film 14, it is possible to reduce occurrence of a white spot caused by α rays in a captured image and to suppress image quality degradation of the captured image.

Furthermore, the α-ray transmission preventive film 14 is provided in a case where the gas layer 20 is formed between the cover substrate 13 and the sensor substrate 11, which is advantageous not only for reducing occurrence of a white spot in a captured image but also for promoting height reduction of the imaging apparatus 10.

That is, by providing the α-ray transmission preventive film 14, even if a distance between the cover substrate 13 and the sensor substrate 11 is small, occurrence of a white spot caused by α rays in a captured image can be suppressed.

Then, by reducing a thickness of the gas layer 20 between the cover substrate 13 and the sensor substrate 11, a size of the entire imaging apparatus 10 in the layering direction D1 (that is, an optical axis direction) can be reduced.

Furthermore, by reducing the thickness of the gas layer 20, the cover substrate 13 and the lower lens 22 can be installed near the photoelectric conversion element 12. The cover substrate 13 and the lower lens 22 form an interface that effectively reflects light. Therefore, by reducing the thickness of the gas layer 20, a light reflection interface can be arranged near the photoelectric conversion element 12. In this case, light can be reflected at a position close to the sensor substrate 11 (in particular, the photoelectric conversion element 12), and the reflected light can be made incident on the photoelectric conversion element 12 on which the reflected light should be originally incident or the photoelectric conversion element 12 in the vicinity.

Figure 30:
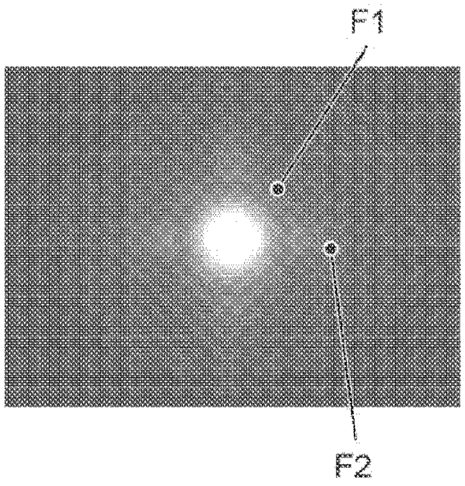
FIG. 30 illustrates an example of a flare (specifically, a ring flare and a cross flare) appearing in a captured image.

A flare (including ghost) is caused when light is incident on a photoelectric conversion element different from the photoelectric conversion element on which the light should be originally incident, due to unintended reflection or the like. In particular, when light is incident on another photoelectric conversion element away from the photoelectric conversion element on which the light should be originally incident, a flare (see a ring flare F1 and a cross flare F2) appears in a conspicuous state in a captured image as illustrated in FIG. 30.

Whereas, by arranging the cover substrate 13 and the lower lens 22 near the photoelectric conversion element 12, it is possible to prevent reflected light from being incident on another photoelectric conversion element 12 away from the photoelectric conversion element 12 on which the reflected light should be originally incident, and to reduce a flare or make the flare less noticeable.

As described above, the imaging apparatus 10 in which the gas layer 20 and the α-ray transmission preventive film 14 are provided between the cover substrate 13 and the sensor substrate 11 is particularly advantageous to reduce a height while reducing occurrence of a white spot and a flare in a captured image and suppressing image quality degradation of the captured image.

Furthermore, by providing the lower lens 22 together with the gas layer 20 between the cover substrate 13 and the sensor substrate 11, it is possible to more effectively reduce occurrence of a flare in a captured image.

That is, an interface between the gas layer 20 and the lower lens 22 constitutes a light reflection interface having a large refractive index difference, and is located closer to the sensor substrate 11 (in particular, the photoelectric conversion element 12) than a light reflection interface constituted by the cover substrate 13. By being reflected at the interface between the gas layer 20 and the lower lens 22, the image-capturing light L unintentionally reflected by the on-chip lens 23 or the sensor substrate 11 can easily be incident more effectively on the photoelectric conversion element 12 on which the image-capturing light L should be originally incident or the photoelectric conversion element 12 in the vicinity. As a result, the flare is further reduced or becomes less noticeable in the captured image.

Furthermore, by providing the upper lens 21 and the lower lens 22, it is possible to increase an adjustment width of a chief ray angle (CRA) in the imaging apparatus 10.

That is, an optical path of the image-capturing light L can also be adjusted by the upper lens 21 and the lower lens 22. Therefore, by providing the upper lens 21 and the lower lens 22, it is possible to relax design conditions of a lens module (not illustrated) provided on an upstream side of the upper lens 21 in traveling of the image-capturing light L.

Specifically, in the lens module, it is no longer necessary to use a high-performance lens, and it is possible to use an inexpensive lens. Furthermore, the number of lenses included in the lens module can be reduced, or a thin lens can be used. Therefore, a size of the entire lens module is reduced, which is advantageous for promoting reduction in height of the entire apparatus including the lens module and the imaging apparatus 10.

Furthermore, by providing the antireflection film 15, it can be expected to suppress reflection of the image-capturing light L to prevent generation of stray light, and suppress deformation such as warpage of components of the imaging apparatus 10.

For example, while a resin material (for example, the upper lens 21 and/or the lower lens 22 containing a transparent resin) is likely to warp, the warpage of the resin material can be suppressed by attaching the antireflection film 15 to such a resin material.

Furthermore, in a case where the support body 30 is formed at a wafer level, a width and a height of the support body 30 can be adjusted with high accuracy. Furthermore, by forming the support body 30 by using a black resin or a metal film, it is possible to prevent stray light from being incident on the photoelectric conversion element 12 and to suppress occurrence of a flare in a captured image. Furthermore, moisture resistance of the support body 30 can also be improved by combining a support main body with an inorganic oxide film, a nitride film, a metal film, or the like.

Modification

In the above-described embodiment, the gas layer 20 is provided between the sensor substrate 11 and the cover substrate 13, but a light transmission layer (for example, a transparent resin) containing a low refractive index material or a high refractive index material may be provided instead of the gas layer 20.

It should be noted that the embodiments and modifications disclosed in the present description are merely exemplification in all respects and are not to be construed as limiting. The above-described embodiments and modifications can be omitted, replaced, and changed in various forms without departing from the scope and spirit of the appended claims. For example, the above-described embodiments and modifications may be combined entirely or partially, and embodiments other than the above may be combined with the above-described embodiments or modifications. Furthermore, the effects of the present disclosure described in the present description are merely exemplification, and other effects may be exhibited.

The technical category embodying the above technical idea is not limited. For example, the above-described technical idea may be embodied by a computer program for causing a computer to execute one or a plurality of procedures (steps) included in a manufacturing method or a usage method for the above-described apparatus. Furthermore, the above-described technical idea may be embodied by a computer-readable non-transitory recording medium in which such a computer program is recorded.

Note that the present disclosure can also have the following configurations.

[Item 1]

An imaging apparatus including:

a sensor substrate having a photoelectric conversion element on which image-capturing light is incident;

a cover substrate that covers the photoelectric conversion element and transmits the image-capturing light; and an α-ray transmission preventive film that transmits the image-capturing light.

[Item 2]

The imaging apparatus according to Item 1, in which the α-ray transmission preventive film has a thickness of 1 μm or less.

[Item 3]

The imaging apparatus according to Item 1 or 2, in which the α-ray transmission preventive film has a transmittance of an α ray of 0.001 count/h or less.

[Item 4]

The imaging apparatus according to any one of Items 1 to 3, in which the α-ray transmission preventive film is arranged between the sensor substrate and the cover substrate.

[Item 5]

The imaging apparatus according to any one of Items 1 to 4, in which the α-ray transmission preventive film is attached to the cover substrate.

[Item 6]

The imaging apparatus according to Item 5, in which a surface of the cover substrate on the sensor substrate side has an uneven shape, and the α-ray transmission preventive film is attached to the surface of the cover substrate on the sensor substrate side.

[Item 7]

The imaging apparatus according to any one of Items 1 to 6, further including an antireflection film attached to the α-ray transmission preventive film.

[Item 8]

The imaging apparatus according to any one of Items 1 to 7, further including:

an on-chip lens that covers the photoelectric conversion element, in which the α-ray transmission preventive film is located between the on-chip lens and the sensor substrate.

[Item 9]

The imaging apparatus according to any one of the Items 1 to 8, further including:

an on-chip lens that covers the photoelectric conversion element, in which the α-ray transmission preventive film is located on a side opposite to the sensor substrate via the on-chip lens.

[Item 10]

The imaging apparatus according to any one of Items 1 to 9, further including a gas layer provided between the sensor substrate and the cover substrate.

[Item 11]

The imaging apparatus according to any one of Items 1 to 10, further including:

a lower lens attached to a surface of the cover substrate on the sensor substrate side, in which the lower lens faces the sensor substrate via a gas layer.

[Item 12]

The imaging apparatus according to Item 11, further including an antireflection film attached to a surface of the lower lens on the sensor substrate side.

[Item 13]

The imaging apparatus according to any one of Items 1 to 12, further including: an upper lens attached to a surface of the cover substrate on a side opposite to the sensor substrate; and an antireflection film attached to a surface of the upper lens on a side opposite to the cover substrate.

[Item 14]

The imaging apparatus according to any one of Items 1 to 13, further including:

a support body that is located between the cover substrate and the sensor substrate and fixes the cover substrate to the sensor substrate, in which the support body includes a light shielding part.

[Item 15]

The imaging apparatus according to any one of Items 1 to 14, further including a light shielding body attached to a portion of the cover substrate outside a portion facing the photoelectric conversion element.

[Item 16]

An imaging apparatus including:

a sensor substrate;

a cover substrate; and a lower lens located between the sensor substrate and the cover substrate and facing the sensor substrate via a gas layer.

[Item 17]

The imaging apparatus according to Item 16, in which the gas layer has a thickness of m or less.

[Item 18]

The imaging apparatus according to Item 16 or 17, further including an antireflection film attached to a surface of the lower lens on the sensor substrate side.

[Item 19]

A manufacturing method for an imaging apparatus, the manufacturing method including:

a step of preparing a first layered body including a cover substrate and an α-ray transmission preventive film;

a step of preparing a second layered body including a sensor substrate; and a step of layering the first layered body and the second layered body such that the α-ray transmission preventive film is located between the cover substrate and the sensor substrate.

[Item 20]

A manufacturing method for an imaging apparatus, the manufacturing method including:

a step of preparing a first layered body including a cover substrate;

a step of preparing a second layered body including a sensor substrate and an α-ray transmission preventive film; and a step of layering the first layered body and the second layered body such that the α-ray transmission preventive film is located between the cover substrate and the sensor substrate.

[Item 21]

A manufacturing method for an imaging apparatus, the manufacturing method including:

a step of preparing a first layered body including a cover substrate and a lower lens;

a step of preparing a second layered body including a sensor substrate; and a step of layering the first layered body and the second layered body such that the lower lens is located between the cover substrate and the sensor substrate.

REFERENCE SIGNS LIST

10 Imaging apparatus
11 Sensor substrate
12 Photoelectric conversion element
13 Cover substrate
14 α-ray transmission preventive film
15 Antireflection film

20 Gas layer
21 Upper lens
22 Lower lens
23 On-chip lens
30 Support body
30*a* First support structure
30*b* Second support structure
31 Light shielding part
33 Light shielding body
40 Logic substrate
41 layered substrate
42 Wiring electrode
43 Connection electrode
44 Solder resist
45 Printed board
51 Organic material layer
52 Color filter layer
53 Planarization film
54 Light shielding film
55 Protective film
D1 Layering direction
D2 Layer extending direction
F1 Ring flare
F2 Cross flare
L Image-capturing light
L1 Stray light

What is claimed is:

1. An imaging apparatus, comprising:

a sensor substrate having a photoelectric conversion element on which image-capturing light is incident;

a cover substrate that covers the photoelectric conversion element and transmits the image-capturing light; and an α-ray transmission preventive film that transmits the image-capturing light, wherein the α-ray transmission preventive film has a thickness of 1 μm or less.

2. The imaging apparatus according to claim 1, wherein the α-ray transmission preventive film has a transmittance of an α ray of 0.001 count/h or less.

3. The imaging apparatus according to claim 1, wherein the α-ray transmission preventive film is arranged between the sensor substrate and the cover substrate.

4. The imaging apparatus according to claim 1, wherein the α-ray transmission preventive film is attached to the cover substrate.

5. The imaging apparatus according to claim 4, wherein a surface of the cover substrate on the sensor substrate side has an uneven shape, and the α-ray transmission preventive film is attached to the surface of the cover substrate on the sensor substrate side.

6. An imaging apparatus, comprising:

a sensor substrate having a photoelectric conversion element on which image-capturing light is incident;

a cover substrate that covers the photoelectric conversion element and transmits the image-capturing light; and an α-ray transmission preventive film that transmits the image-capturing light, wherein the α-ray transmission preventive film has a transmittance of an α ray of 0.001 count/h or less.

7. The imaging apparatus according to claim 6, wherein the α-ray transmission preventive film is arranged between the sensor substrate and the cover substrate.

8. The imaging apparatus according to claim 6, wherein the α-ray transmission preventive film is attached to the cover substrate.

9. The imaging apparatus according to claim 8, further comprising an antireflection film attached to the α-ray transmission preventive film.

10. The imaging apparatus according to claim 6, further comprising:

an on-chip lens that covers the photoelectric conversion element, wherein the α-ray transmission preventive film is located between the on-chip lens and the sensor substrate.

11. The imaging apparatus according to claim 6, further comprising:

an on-chip lens that covers the photoelectric conversion element, wherein the α-ray transmission preventive film is located on a side opposite to the sensor substrate via the on-chip lens.

12. The imaging apparatus according to claim 6, further comprising: an upper lens attached to a surface of the cover substrate on a side opposite to the sensor substrate; and an antireflection film attached to a surface of the upper lens on a side opposite to the cover substrate.

13. The imaging apparatus according to claim 6, further comprising:

a support body that is located between the cover substrate and the sensor substrate and fixes the cover substrate to the sensor substrate, wherein the support body includes a light shielding part.

14. The imaging apparatus according to claim 6, further comprising a light shielding body attached to a portion of the cover substrate outside a portion facing the photoelectric conversion element.

15. An imaging apparatus, comprising:

a sensor substrate having a photoelectric conversion element on which image-capturing light is incident;

a cover substrate that covers the photoelectric conversion element and transmits the image-capturing light; and an α-ray transmission preventive film that transmits the image-capturing light, wherein the α-ray transmission preventive film is attached to the cover substrate, wherein a surface of the cover substrate on the sensor substrate side has an uneven shape, and wherein the α-ray transmission preventive film is attached to the surface of the cover substrate on the sensor substrate side.

16. An imaging apparatus, comprising:

a sensor substrate having a photoelectric conversion element on which image-capturing light is incident;

a cover substrate that covers the photoelectric conversion element and transmits the image-capturing light; and an α-ray transmission preventive film that transmits the image-capturing light, further comprising a gas layer provided between the sensor substrate and the cover substrate.

17. The imaging apparatus according to claim 16, further comprising:

a lower lens attached to a surface of the cover substrate on the sensor substrate side, wherein the lower lens faces the sensor substrate via the gas layer.

18. The imaging apparatus according to claim 17, further comprising an antireflection film attached to a surface of the lower lens on the sensor substrate side.

19. An imaging apparatus, comprising:
a sensor substrate;
a cover substrate; and
a lower lens located between the sensor substrate and the cover substrate and facing the sensor substrate via a gas layer, wherein the gas layer has a thickness of 20 μm or less.

20. The imaging apparatus according to claim 19, further comprising an antireflection film attached to a surface of the lower lens on the sensor substrate side.

* * * * *